(12) United States Patent
Wallner et al.

(10) Patent No.: US 7,245,239 B2
(45) Date of Patent: Jul. 17, 2007

(54) SYNCHRONOUS PARALLEL/SERIAL CONVERTER

(75) Inventors: Paul Wallner, Prien (DE); Peter Gregorius, Munich (DE); Ralf Schledz, Zolling (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/331,478

(22) Filed: Jan. 13, 2006

(65) Prior Publication Data

US 2006/0181444 A1    Aug. 17, 2006

(51) Int. Cl.
*H03M 9/00* (2006.01)
(52) U.S. Cl. .............................. 341/100; 341/101
(58) Field of Classification Search ............. 341/100, 341/101
See application file for complete search history.

(56) References Cited

U.S. PATENT DOCUMENTS 6,259,387 B1 * 7/2001 Fukazawa .................. 341/100
6,801,144 B2 * 10/2004 Matsudera et al. ......... 341/100
2003/0095057 A1   5/2003 Gredone et al.

FOREIGN PATENT DOCUMENTS

DE   10 2004 026 526    1/2005
JP         61030122     2/1986

* cited by examiner

*Primary Examiner*—Jean Bruner Jeanglaude
(74) *Attorney, Agent, or Firm*—Dicke, Billig & Czaja, PLLP

(57) ABSTRACT

A synchronous parallel/serial converter is disclosed. In one embodiment, the a synchronous parallel/serial converter that receives a parallel n-bit input signal and comprising a first shift register that receives an odd-numbered part of the input signal with a first load signal in synchronism with a clock signal having a clock rate half the clock rate of a system clock, and provides a serial output as a first one-bit signal sequence; a second shift register that receives an even-numbered part of the input signal with a second load signal synchronism with the clock signal and provides a serial output as a second one-bit signal sequence; and a fusion unit that fuses the first serial one-bit signal sequence synchronously with the clock signal and the second serial one-bit signal sequence in synchronism the clock signal to form a serial one-bit output signal.

23 Claims, 3 Drawing Sheets

SYNCHRONOUS PARALLEL/SERIAL CONVERTER

CROSS-REFERENCE TO RELATED APPLICATIONS

This Utility Patent Application claims priority to German Patent Application No. DE 10 2005 001 894.7 filed on Jan. 14, 2005, which is incorporated herein by reference.

FIELD OF THE INVENTION

The invention relates to a synchronous parallel/serial converter for conversion of a parallel n-bit input signal to a serial one-bit output signal sequence in synchronism with a clock signal whose clock rate is half the clock rate of a system clock signal.

BACKGROUND

In previous DDR-DRAM semiconductor memories, the individual semiconductor memory components were supplied with the data, address and control signals as well as clock signals via separate bus line systems in each case. The read and write data was normally transmitted bi-directionally using a specific number of parallel data bits.

As a result of the considerably higher transmission rates (up to 7.2 Gbits/s per pin), data signals as well as address and control signals, and the clock signals as well, will be transmitted via differential signal lines in the next generation (for example DDR4 and NMT (New Memory Technology)) of DDR-DRAM memories that are currently being developed. For this reason, the number of pins for these signals would have to be at least doubled for the conventional architecture of memory transmitting and receiving interfaces. However, such an increased number of pins is neither desirable nor possible, either for the individual memory components (chips) or for the memory modules on which they are mounted.

In order to reduce the number of pins and, since the data, control and address signals will be transmitted unidirectionally in the next memory generation, new transmitting and receiving interface circuits are being developed which will transmit and receive the data, control and address signals to be transmitted within one frame (signal frame), that is to say in each case matching a transmitting and receiving protocol and complying with very strict time conditions. These signals will likewise, of course, be transmitted differentially, with the clock signal being transmitted separately. Protocol-oriented transmitting and receiving interface circuits such as these require high-speed coding and decoding logic in the transmitting and receiving section of the memory interface, with data and clock preprocesssing being required in the receiving section.

In order to combine the data bits which are read from the memory arrays and are to be transmitted to form a data stream which matches the protocol, the transmitting part of the memory interface requires parallel/serial conversion, which converts the data which is read in a parallel form comprising a plurality of bits from the memory arrays, to a serial one-bit data signal stream in synchronism with the clock signal.

SUMMARY

The present invention provides a synchronous parallel/serial converter. In one embodiment, the a synchronous parallel/serial converter is for conversion of a parallel n-bit input signal to a serial one-bit output signal stream in synchronism with a clock signal whose clock rate is half the clock rate of a system clock. The parallel/serial converter has a first shift register which receives an odd-numbered part of the input signal with a first load signal in parallel in synchronism with the rear or front flank of the clock signal, and emits this in serial form as a first one-bit signal sequence. A second shift register receives an even-numbered part of the input signal with a second load signal in parallel in synchronism with the front or rear flank of the clock signal and emits it in serial form as a second one-bit signal sequence. A fusion unit receives the first one-bit signal sequence from the first shift register, the second one-bit signal sequence from the second shift register and the clock signal and fuses the first serial one-bit signal sequence synchronously with the rear or front flank of the clock signal and the second serial one-bit signal sequence in synchronism with the front or rear flank of the clock signal to form the output signal stream.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
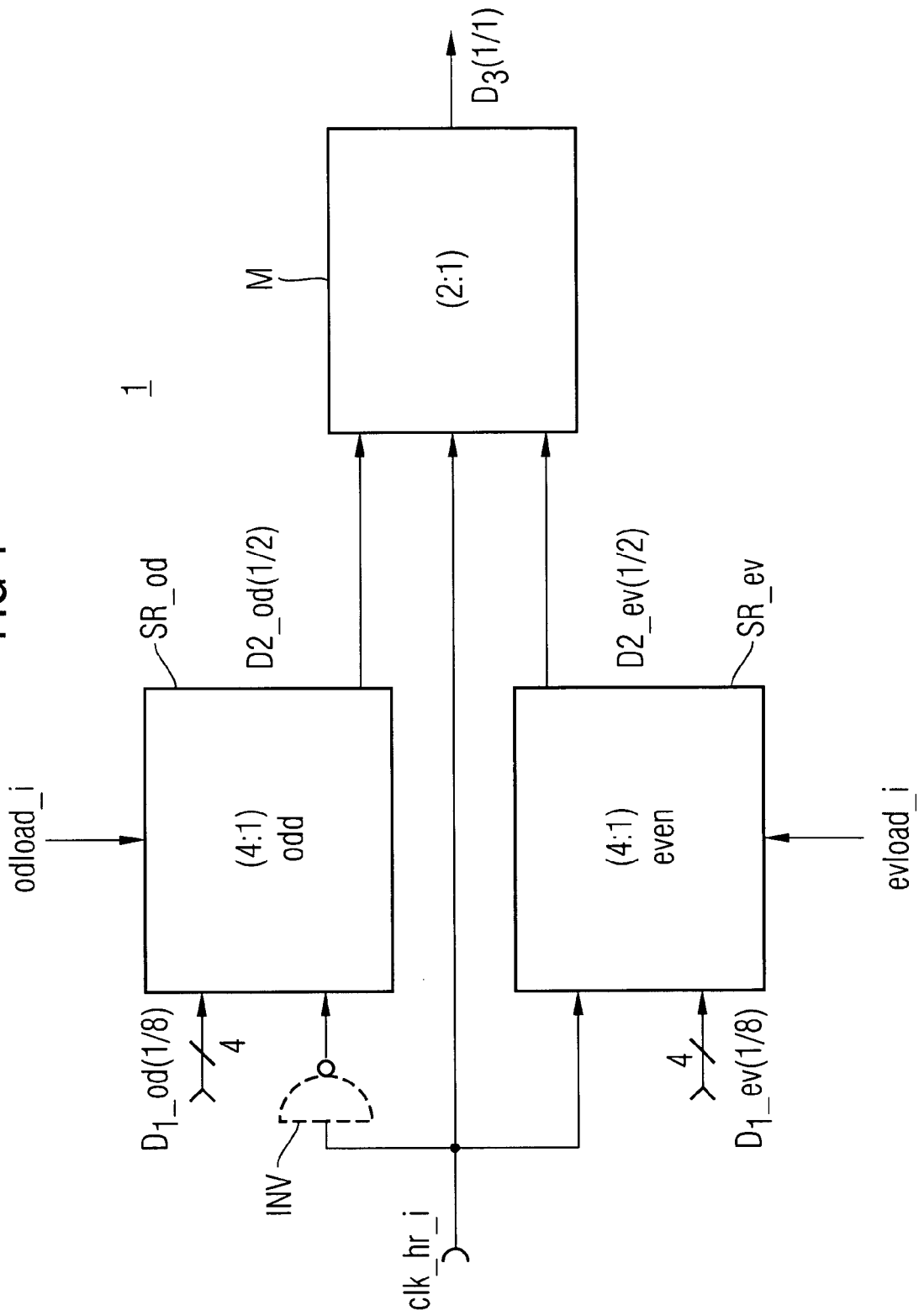
FIG. 1 illustrates, schematically, a basic configuration of the preferred exemplary embodiment of the synchronous parallel/serial converter according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a synchronous parallel/serial converter which is matched to such parallel/serial conversion in the transmitting part of a memory interface for the next DDR-DRAM generations, for conversion of a parallel n-bit input signal to a serial output signal stream in synchronism with a clock signal, such that this results in reliable and stable reception of the input signal while at the same time maintaining a short latency time for this in the parallel/serial converter.

In one embodiment, a synchronous parallel/serial converter for conversion of a parallel n-bit input signal to a serial one-bit output signal stream in synchronism with a clock signal whose clock rate is half the clock rate of a system clock signal includes a first shift register which receives an odd-numbered part of the input signal with a first load signal in parallel in synchronism with the rear or front flank of the clock signal, and emits this in serial form as a first one-bit signal sequence. A second shift register receives an even-numbered part of the input signal with a second load signal in parallel in synchronism with the front or rear flank of the clock signal and emits it in serial form as a second one-bit signal sequence. A fusion unit receives the first one-bit signal sequence from the first shift register, the second one-bit signal sequence from the second shift register and the clock signal and fuses the first serial one-bit signal sequence synchronously with the rear or front flank of the clock signal and the second serial one-bit signal sequence in synchronism with the front or rear flank of the clock signal to form the output signal stream and emits this.

According to one exemplary embodiment, n=8, the first and second shift registers each respectively receive the odd-numbered and even-numbered four-bit halves of the eight-bit input signal at one eighth of the system clock rate and emit the first and the second serial one-bit signal sequence at half the system clock rate.

In order to achieve reliable and stable data reception in the first and second shift registers, the phases of the odd-numbered component and of the even-numbered component of the input signal, of the clock signal and of the first and second load signals are each synchronized to one another.

In one exemplary embodiment, it is advantageous that the phase angle of the first load signal and of the second load signal or the phase angle of an internal load signal, which is produced from the first and second load signals in the first and second shift registers, respectively, can be varied relative to the front and/or rear flank of the clock signal.

The clock signal may be in the form of a differential clock signal. In addition, the clock signal can also be applied with the full CMOS level.

The parallel/serial converter according to the invention is used for parallel/serial conversion of a data signal in a transmitting circuit section of the interface circuit of a DDR-DRAM semiconductor memory for the future DDR-DRAM memory generations.

In one exemplary embodiment, the synchronous parallel/serial converter 1 according to the invention, which is illustrated schematically in the form of a functional block diagram in FIG. 1, has a first (4:1) shift register SR_od and a second (4:1) shift register SR_ev as well as a (2:1) fusion unit M. The first and the second shift register SR_od and SR_ev as well as the fusion unit M receive a half-rate clock clk_hr_i derived from a system clock sys_clk (which is not illustrated). It should be noted that the system clock sys_clk does not need to be supplied to the parallel/serial converter but is just fictionally present for the purposes of this description.

The fusion unit M is connected downstream from the first and the second shift register SR_od and SR_ev in the processing direction. A parallel input signal, which previously comprised 8 bits, arrives split into an input signal D1_od, which includes the odd-numbered 4 bits, and an input signal D1_ev, which includes the even-numbered 4 bits, at the first shift register SR_od and at the second shift register SR_ev, respectively. In the first shift register SR_od the odd-numbered parallel four-bit component D1_od of the input signal is converted by means of a load signal odload_i, in synchronism with the rear (or front) flank of the half-rate clock signal clk_hr_i to a first serial signal sequence D2_od (1/2), which comprises the odd-numbered bits of the input signal. Furthermore, the second shift register SR_ev receives the even-numbered component D1_ev of the parallel input signal with the second load signal evload_i in synchronism with the front (or rear) flank of the half-rate clock signal clk_hr_i, and converts this to a second serial signal sequence D2_ev (1/2). These two serial signal sequences D2_od (1/2) and D2_ev (1/2) which are emitted from the two shift registers SR_od and SR_ev are received by the fusion unit M which converts them, respectively in synchronism with the clock rear (and front) flank to a serial output signal stream D3(1/1), whose signal rate is the same as that of the system clock sys_clk.

It should also be noted that FIG. 1 illustrates an inversion element INV by dashed lines, which can optionally be used and which results in the circuit design of the first and of the second shift register SR_od and SR_ev in each case being the same. It is also worth noting that the half-rate clock signal clk_hr_i is applied as a differential clock signal (although this is not illustrated in FIG. 1), and can be applied at the full MOS level. If the clock signal clk_hr_i is supplied in a differential form, the inversion element INV can be omitted, because the positive and negative phases can be interchanged, instead of the inversion element INV.

One skilled in the art would be immediately aware that the described numbers of parallel input signal bits, as illustrated in FIG. 1, are only by way of example.

In order to ensure reliable reception of the parallel input signal in the first and second shift registers SR_od and SR_ev, it is important in each case for the phases of the odd-numbered part D1_od and of the even-numbered part D1_ev of the input signal, of the half-rate clock signal clk_hr_i and of the first and second load signals odload_i, evload_i to each be synchronized to one another. In order to receive the odd-numbered and even-numbered bits D1_od and D1_ev arriving at the respective first and second shift registers SR_od and SR_ev with a short latency time and reliably in the two shift registers, a fixed phase difference is set between the first load signal odload_i and the second load signal evload_i of one half of a clock cycle of the half-rate clock cycle clk_hr_i. The timings and thus also the functions of the synchronous parallel/serial converter 1 as illustrated in FIG. 1 are illustrated in the form of graphs in the pulse timing diagrams in FIGS. 2 to 4. In this case, it may be advantageous for the common phase angle of the first and second load signals odload_i, evload_i, or that of an internal load signal which is produced from the first and second load signals in the first and second shift registers respectively, to be variable relative to the front and/or rear flank of the half-rate clock signal clk_hr_i.

Figure 2:
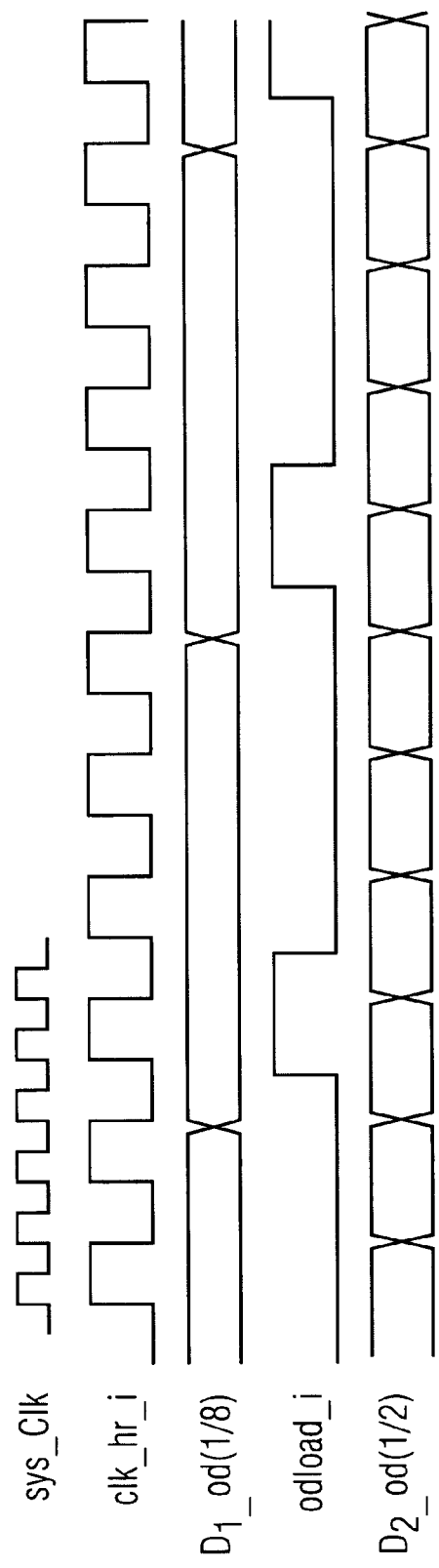
FIGS. 2–4 illustrate, in the form of graphs, pulse timing diagrams in order to explain the operation of the synchronous parallel/serial converter illustrated in FIG. 1.
Figure 3:
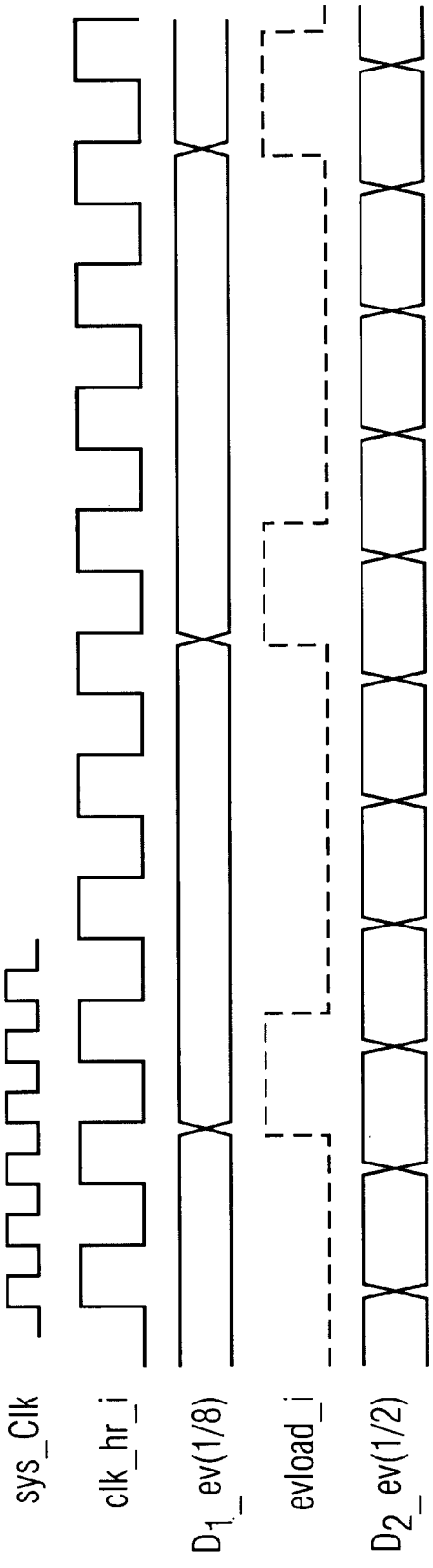
Figure 4:
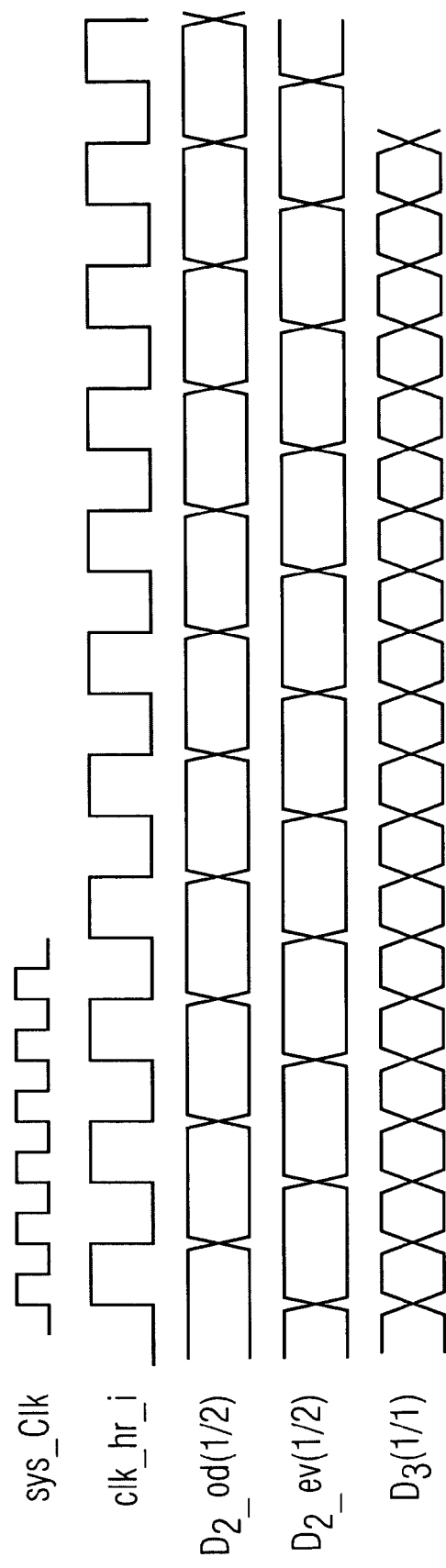

The signal timing diagrams in FIGS. 2 to 4 show that the first and second load signals odload_i and evload_i have a fixed phase difference of half the clock period of the half-rate clock signal clk_hr_i between them which allows sampling or transfer (offset in time by half the clock period (half the clock cycle) of the half-rate clock signal clk_hr_i) of the odd-numbered component D1_od (1/8) to the first shift register SR_od and of the even-numbered component D1_ev (1/8) to the second shift register SR_ev and likewise the outputting (offset in time by half a clock period of the half-rate clock signal clk_hr_i) of the first serial signal sequence D2_od (1/2) from the first shift register SR_od, and of the second serial signal sequence D2_ev from the second shift register SR_od (see FIG. 4). This sampling in each case with the front and the rear flank of the half-rate clock signal clk_hr_i in the fusion unit M allows the latter to emit the serial output signal stream D3 (1/1), which contains the even-numbered and odd-numbered data bits fused with one another with the correct timings, in synchronism with the system clock signal, sys_clk, and with its periodicity.

Because of the mentioned capability to vary the common phase angle of the front and/or rear flank of the load signal odload_i and evload_i, the sampling of the parallel bits of the input signal and their transfer to the first and second shift registers SR_od and SR_ev can be carried out earlier or later with respect to the time of the change in the input signal. This is advantageous since it is possible to choose (vary) the compromise between the latency time and stable sampling of the input signal.

In one exemplary embodiment, the signals that have been converted from parallel to serial form are data signals which are processed in a transmitting interface circuit of a DDR4-DRAM memory chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A synchronous parallel/serial converter that receives a parallel n-bit input signal, comprising:
    a first shift register that receives an odd-numbered part of the input signal with a first load signal in synchronism with one of the front and rear flank of a clock signal having a clock rate half the clock rate of a system clock, and provides a serial output as a first one-bit signal sequence;
    a second shift register that receives an even-numbered part of the input signal with a second load signal in synchronism with the respective other of the front and rear flank of the clock signal and provides a serial output as a second one-bit signal sequence, wherein the first and second load signals have a fixed phase difference between them, and wherein a phase angle of the first load signal and of the second load signal varies relative to the front and/or rear flank of the clock signal; and
    a fusion unit that fuses the first serial one-bit signal sequence synchronously with the clock signal and the second serial one-bit signal sequence in synchronism the clock signal to form a serial one-bit output signal.

2. The converter of claim 1, comprising:
    wherein n=8, the first and second shift registers each respectively receive the odd-numbered and even-numbered four-bit halves of the eight-bit input signal at one eighth of the clock rate of the system clock and emit the first and the second serial one-bit signal sequence at half the clock rate of the system clock.

3. The converter of claim 1, comprising wherein the phases of the odd-numbered part and of the even-numbered part of the input signal, of the clock signal and of the first and second load signals are each synchronized to one another.

4. A DRAM memory component comprising:
    a DRAM memory; and
    a transmission interface circuit having a converter of claim 1 for conversion of a data signal.

5. The converter of claim 1, comprising wherein the fixed phase difference is half the clock period of the clock signal.

6. The converter of claim 1, comprising wherein the clock signal which is supplied is a differential clock signal.

7. The converter of claim 1, comprising wherein the clock signal uses MOS levels.

8. The converter of claim 1, comprising wherein the converter is configured for parallel/serial conversion of a data signal in a transmission interface circuit in a DRAM semiconductor memory component.

9. The converter of claim 8, comprising wherein the DRAM semiconductor memory component is a DDR4-DRAM memory chip.

10. A synchronous parallel/serial converter for conversion of a parallel n-bit input signal to a serial one-bit output signal stream in synchronism with a clock signal whose clock rate is half the clock rate of a system clock, comprising:
    a first shift register configured to take in an odd-numbered part of the input signal with a first load signal in parallel in synchronism with one of the front and rear flank of the clock signal, and emits this odd numbered part in serial form as a first one-bit signal sequence;
    a second shift register configured to take in an even-numbered part of the input signal with a second load signal in parallel in synchronism with the respective other of the front and rear flank of the clock signal and emits this even numbered part in serial form as a second one-bit signal sequence; and
    a fusion unit configured to receive the first one-bit signal sequence from the first shift register, the second one-bit signal sequence from the second shift register and the clock signal and to fuse the first serial one-bit signal sequence synchronously with one of the front and rear flank of the clock signal and the second serial one-bit signal sequence in synchronism with the respective other of the front and rear flank of the clock signal to form the output signal stream, wherein the first and second load signals have a fixed phase difference of half the clock period of the clock signal between them, and wherein the phase angle of the first and second load signal varies relative to the front and/or rear flank of the clock signal.

11. The converter of claim 10, comprising wherein n=8, the first and second shift registers each respectively receive the odd-numbered and even-numbered four-bit halves of the eight-bit input signal at one eighth of the clock rate of the system clock and emit the first and the second serial one-bit signal sequence at half the clock rate of the system clock.

12. The converter of claim 10, comprising wherein the phases of the odd-numbered part and of the even-numbered part of the input signal, of the clock signal and of the first and second load signals are each synchronized to one another.

13. The converter of claim 10, comprising wherein the converter is configured for parallel/serial conversion of a data signal in a transmission interface circuit in a DRAM semiconductor memory component.

14. The converter of claim 13, comprising wherein the DRAM semiconductor memory component is a DDR4-DRAM memory chip.

15. The converter of claim 10, comprising wherein the clock signal which is supplied is a differential clock signal.

16. The converter of claim 10, wherein the clock signal uses MOS levels.

17. A synchronous parallel/serial converter for conversion of a parallel n-bit input signal to a serial one-bit output signal stream in synchronism with a clock signal whose clock rate is half the clock rate of a system clock, comprising:
- a first shift register which receives an odd-numbered part of the input signal with a first load signal in parallel in synchronism with of the front and rear flank of the clock signal, and emits the odd-numbered part of the input sianal in serial form as a first one-bit signal sequence;
- a second shift register which receives an even-numbered part of the input signal with a second load signal in parallel in synchronism with the respective other of the front and rear flank of the clock signal and emits the even-numbered part of the input signal in serial form as a second one-bit signal sequence, wherein the first and second load signals have a fixed phase difference of half the clock period of the clock signal between them, and wherein the phase angle of the first load signal and of the second load signal varies relative to the front and/or rear flank of the clock signal; and
- a fusion unit which receives the first one-bit signal sequence from the first shift register, the second one-bit signal sequence from the second shift register and the clock signal and fuses the first serial one-bit signal sequence synchronously with the rear or front flank of the clock signal and the second serial one-bit signal sequence in synchronism with the front or rear flank of the clock signal to form the output signal stream.

18. The synchronous parallel/serial converter of claim 17, wherein n=8, the first and second shift registers each respectively receive the odd-numbered and even-numbered four-bit halves of the eight-bit input signal at one eighth of the clock rate of the system clock and emit the first and the second serial one-bit signal sequence at half the clock rate of the system clock.

19. The synchronous parallel/serial converter of claim 18, comprising wherein the phases of the odd-numbered part and of the even-numbered part of the input signal, of the clock signal and of the first and second load signals are each synchronized to one another.

20. The synchronous parallel/serial converter of claim 19, comprising wherein the phase angle of an internal load signal, which is produced from the first and second load signals in the first and second shift registers, respectively, can be varied relative to the front and/or rear flank of the clock signal.

21. The synchronous parallel/serial converter of claim 17, comprising wherein the clock signal which is supplied is a differential clock signal.

22. The synchronous parallel/serial converter of claim 21, comprising wherein the clock signal uses MOS levels.

23. A synchronous parallel/serial converter that receives a parallel n-bit input signal, comprising:
- means for providing a first shift register that receives an odd-numbered part of the input signal with a first load signal in synchronism with one of the front and rear flank of a clock signal having a clock rate half the clock rate of a system clock, and provides a serial output as a first one-bit signal sequence;
- means for providing a second shift register that receives an even-numbered part of the input signal with a second load signal synchronism with the respective other of the front and rear flank of the clock signal and provides a serial output as a second one-bit signal sequence; and
- means for providing a fusion unit that fuses the first serial one-bit signal sequence synchronously with one of the front and rear flank of the clock signal and the second serial one-bit signal sequence in synchronism with the respective other of the front and rear flank of the clock signal to form a serial one-bit output signal, wherein the first and second load signals have a fixed phase difference of half the clock period of the clock signal between them, and wherein the phase angle of the first load signal and of the second load signal varies relative to the front and/or rear flank of the clock signal.

* * * * *

UNITED STATES PATENT AND TRADEMARK OFFICE
CERTIFICATE OF CORRECTION

| | |
|---|---|
| PATENT NO. | : 7,245,239 B2 |
| APPLICATION NO. | : 11/331478 |
| DATED | : July 17, 2007 |
| INVENTOR(S) | : Paul Wallner, Peter Gregorius and Ralf Schledz |

Page 1 of 1

It is certified that error appears in the above-identified patent and that said Letters Patent is hereby corrected as shown below:

Title page item 30, below Prior Publication Data, add the following:

Foreign Application Priority Data

Jan. 14, 2005          (DE)          10 2005 001 894.7

Signed and Sealed this

Eleventh Day of March, 2008

JON W. DUDAS
*Director of the United States Patent and Trademark Office*